US010804093B2

(12) United States Patent
Chen et al.

(10) Patent No.: US 10,804,093 B2
(45) Date of Patent: Oct. 13, 2020

(54) DISHING PREVENTION COLUMNS FOR BIPOLAR JUNCTION TRANSISTORS

(71) Applicant: Taiwan Semiconductor Manufacturing Co., Ltd., Hsin-Chu (TW)

(72) Inventors: Yi-Huan Chen, Hsin Chu (TW); Chien-Chih Chou, New Taipei (TW); Kong-Beng Thei, Pao-Shan Village (TW); Meng-Han Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/587,819

(22) Filed: Sep. 30, 2019

(65) Prior Publication Data

US 2020/0027845 A1    Jan. 23, 2020

Related U.S. Application Data

(62) Division of application No. 15/935,363, filed on Mar. 26, 2018, now Pat. No. 10,510,685.

(Continued)

(51) Int. Cl.
*H01L 21/02* (2006.01)
*H01L 23/00* (2006.01)
(Continued)

(52) U.S. Cl.
CPC .. *H01L 21/02065* (2013.01); *H01L 21/31053* (2013.01); *H01L 23/562* (2013.01);
(Continued)

(58) Field of Classification Search
CPC .......... H01L 21/31053; H01L 29/0603; H01L 2224/03616; H01L 21/02065;
(Continued)

(56) References Cited

U.S. PATENT DOCUMENTS 6,396,110 B1 *  5/2002  Yokoyama ........ H01L 21/76802
                                                          257/378
10,340,357 B2   7/2019  Chen et al.
(Continued)

OTHER PUBLICATIONS

Thomas Y. Hoffmann. Integrating High-K/Metal Gates: Gate-First or Gate-Last? Solid State Technology. Published in 2017.
(Continued)

*Primary Examiner* — Feifei Yeung Lopez
(74) *Attorney, Agent, or Firm* — Eschweiler & Potashnik, LLC

(57) ABSTRACT

In some embodiments, a bipolar junction transistor (BJT) is provided. The BJT may include a collector region that is disposed within a semiconductor substrate. A base region that is disposed within the semiconductor substrate and arranged within the collector region. An emitter region that is disposed within the semiconductor substrate and arranged within the base region. A pre-metal dielectric layer that is disposed over an upper surface of the semiconductor substrate and that separates the upper surface of the semiconductor substrate from a lowermost metal interconnect layer. A first plurality of dishing prevention columns that are arranged over the emitter region and within the pre-metal dielectric layer, where the plurality of dishing prevention columns each include a dummy gate that is conductive and electrically floating.

20 Claims, 7 Drawing Sheets

Related U.S. Application Data

(60) Provisional application No. 62/565,216, filed on Sep. 29, 2017.

(51) Int. Cl.
  *H01L 29/735* (2006.01)
  *H01L 21/3105* (2006.01)
  *H01L 29/66* (2006.01)
  *H01L 29/08* (2006.01)
  *H01L 29/06* (2006.01)
  *H01L 29/10* (2006.01)

(52) U.S. Cl.
  CPC ...... *H01L 29/0603* (2013.01); *H01L 29/0642* (2013.01); *H01L 29/0649* (2013.01); *H01L 29/0692* (2013.01); *H01L 29/0808* (2013.01); *H01L 29/1008* (2013.01); *H01L 29/6625* (2013.01); *H01L 29/735* (2013.01); *H01L 2224/03616* (2013.01)

(58) Field of Classification Search
  CPC ............... H01L 29/0692; H01L 23/562; H01L 29/6625; H01L 29/735
  See application file for complete search history.

(56) References Cited

U.S. PATENT DOCUMENTS

| | | |
|---|---|---|
| 2004/0089950 A1 | 5/2004 | Nanjo |
| 2007/0221957 A1 | 9/2007 | Kitajima et al. |
| 2010/0001369 A1* | 1/2010 | Chuang ............... H01L 21/8249 257/526 |
| 2010/0052060 A1 | 3/2010 | Lai |
| 2011/0156149 A1 | 6/2011 | Wang et al. |
| 2011/0220963 A1 | 9/2011 | Chuang |
| 2011/0233717 A1 | 9/2011 | Jensen et al. |
| 2012/0098095 A1 | 4/2012 | Lin et al. |
| 2012/0098096 A1 | 4/2012 | Lin et al. |
| 2012/0256310 A1 | 10/2012 | Ide |
| 2013/0320396 A1 | 12/2013 | Salman et al. |
| 2015/0179779 A1 | 6/2015 | Liao |
| 2017/0125401 A1 | 5/2017 | Gu et al. |
| 2017/0179306 A1 | 6/2017 | Hsiao et al. |

OTHER PUBLICATIONS

U.S. Appl. No. 15/964,572, filed Apr. 27, 2018.
Non Final Office Action dated Jan. 31, 2019 in connection with U.S. Appl. No. 15/964,572.
Ntc of Allowance dated May 1, 2019 in connection with U.S. Appl. No. 15/964,572.
Non-Final Office Action dated Sep. 5, 2019 for U.S. Appl. No. 16/437,137.
Non-Final Office Action dated Apr. 1, 2019 for U.S. Appl. No. 15/935,363.
Notice of Allowance dated Aug. 27, 2019 for U.S. Appl. No. 15/935,363.

* cited by examiner

DISHING PREVENTION COLUMNS FOR BIPOLAR JUNCTION TRANSISTORS

REFERENCE TO RELATED APPLICATIONS

This Application is a Divisional of U.S. application Ser. No. 15/935,363, filed on Mar. 26, 2018, which claims the benefit of U.S. Provisional Application No. 62/565,216, filed on Sep. 29, 2017. The contents of the above-referenced Patent Applications are hereby incorporated by reference in their entirety.

BACKGROUND

Bipolar junction transistors (BJTs) are commonly used in digital and analog integrated circuit (IC) devices for high frequency applications. A BJT includes two p-n junctions sharing a cathode or anode region, which is called the base. The base separates two regions having a same conductivity type, called the emitter and collector, which is opposite the conductivity type of the base. Depending on the conductivity types, a BJT can be of the NPN variety or the PNP variety. Due to the structure of a BJT, a BJT generally spans over a large portion of an IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
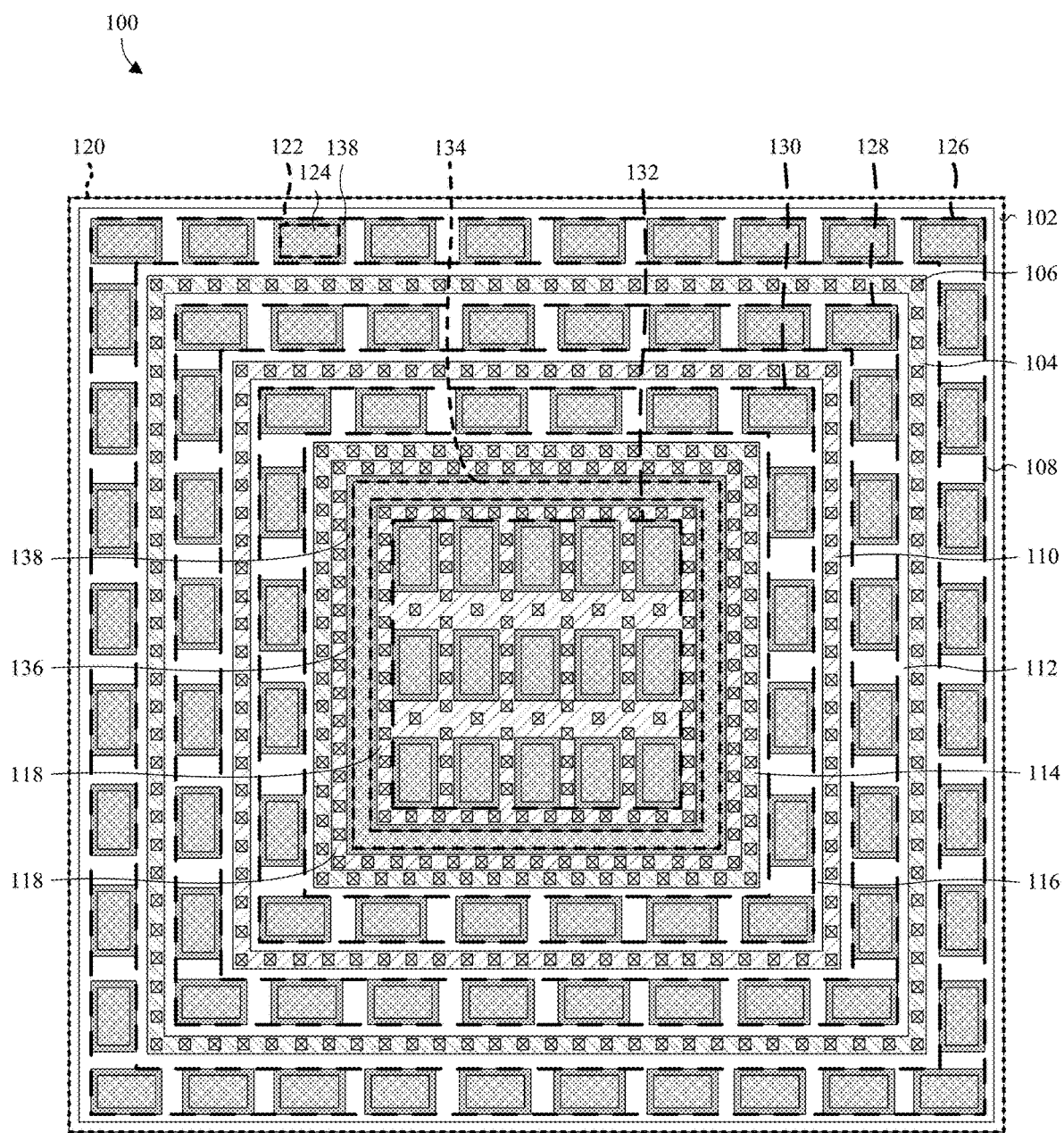
FIG. 1 illustrates a top view of some embodiments of a bipolar junction transistor having a plurality of dishing prevention columns.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some approaches, an integrated circuit (IC) having a bipolar junction transistor (BJT) is manufactured by forming a collector region having a first conductivity type (e.g., n-type having a doping concentration) in a semiconductor substrate. A base region having a second conductivity type (e.g., p-type having a doping concentration) is then formed within the semiconductor substrate and arranged within the collector region. An emitter region having the first conductivity type (e.g., n-type having a doping concentration) is formed within the semiconductor substrate and arranged within the base region. Thus, a BJT is formed having a first p-n junction between the emitter region and the base region, and a second p-n junction between the base region and the collector region.

After the BJT is formed, a pre-metal dielectric layer is disposed over an upper surface of the semiconductor substrate to provide electrical isolation between devices of the IC and subsequently formed interconnect layers. Generally, after the pre-metal dielectric layer is formed a chemical-mechanical planarization (CMP) process is performed on the pre-metal dielectric layer. The CMP process removes portions of the pre-metal dielectric layer, for example, to expose underlying features of the IC devices (e.g., a sacrificial gate) for subsequent processing (e.g., etching for a replacement poly-gate (RPG) process) and/or provide a uniform height for the underlying features (e.g., to form a uniform metal gate height) of the devices and the pre-metal dielectric layer. In addition, various other CMP processes (e.g., CMP process to planarize metal gates formed via a RPG process) may remove portions of the pre-metal dielectric layer. However, due to the process parameters of the CMP process(es) (e.g., chemical slurry composition, pressure, velocity, time, etc.) and the various types of materials disposed within the pre-metal dielectric layer (e.g., dielectric, metal, polysilicon, etc.), the CMP process(es) may cause dishing in the pre-metal dielectric layer (as the various materials are removed at different rates during the CMP process). This dishing may be exacerbated over BJT devices due to the generally large area that a BJT spans across. Accordingly, the dishing may cause decreased device performance due to excess removal of the pre-metal dielectric (or other underlying materials), and in some severe instances the dishing may cause improperly functioning devices.

Therefore, the present disclosure is directed to a BJT having a plurality of dishing prevention columns disposed over the BJT and within the pre-metal dielectric layer. The dishing prevention columns act as structural support for the pre-metal dielectric layer during CMP processes. Thus, when a CMP process is performed that removes portions of the pre-metal dielectric layer, the plurality of dishing prevention columns may reduce the amount of dishing that occurs over the BJT. In addition, forming the plurality of dishing prevention columns may be incorporated into process steps that may already be used (e.g., gate formation, gate spacer formation, RPG process, fully silicided gate processes, etc.) to form other features of the IC (e.g., devices in other regions of the IC). Accordingly, the plurality of dishing prevention columns may increase device performance and reduce the cost to manufacture ICs by reducing the amount of dishing that occurs over a BJT.

FIG. 1 illustrates a top view of some embodiments of a bipolar junction transistor having a plurality of dishing prevention columns.

As illustrated in FIG. 1, a bipolar junction transistor (BJT) 100 is disposed over/within a semiconductor substrate 102. The semiconductor substrate 102 may comprise any type of semiconductor body (e.g., monocrystalline silicon/CMOS bulk, silicon-germanium (SiGe), silicon on insulator (SOI), etc.). In some embodiments, the semiconductor substrate 102 may comprise an epitaxial layer grown on an underlying semiconductor material.

The BJT may comprise a substrate isolation region 104 disposed within the semiconductor substrate 102. The substrate isolation region 104 comprises a first conductivity type (e.g., n-type or p-type) that has a first doping concentration. In some embodiments, the substrate isolation region 104 may have a ring-shaped layout. In further embodiments, the substrate isolation region 104 may be concentric about a center point of the BJT 100. In yet further embodiments, a plurality of contacts 106 configured to provide a voltage to the substrate isolation region 104 may be disposed over and coupled to the substrate isolation region 104.

In some embodiments, a first isolation structure 108 may be disposed within the semiconductor substrate 102 and surround the substrate isolation region 104. The first isolation structure 108 may be a shallow trench isolation (STI) region or a deep trench isolation (DTI) region. In further embodiments, the first isolation structure 108 may have a ring-shaped layout. In yet further embodiments, the first isolation structure 108 may be concentric about the center point of the BJT 100.

A collector region 110 may be disposed within the semiconductor substrate 102 and separated from the substrate isolation region 104 by a second isolation structure 112. The collector region 110 comprises a second conductivity type (e.g., n-type or p-type), which is different than the first conductivity type, that has a second doping concentration. In some embodiments, the collector region 110 may have a ring-shaped layout. In further embodiments, the collector region 110 may be concentric about a center point of the BJT 100. In yet further embodiments, a plurality of contacts 106 configured to provide a voltage to the collector region may be disposed over and coupled to the collector region 110.

In some embodiments, the second isolation structure 112 may be disposed within the semiconductor substrate 102 and arranged between the collector region 110 and the substrate isolation region 104. The second isolation structure 112 may be a STI region or a DTI region. In further embodiments, the second isolation structure 112 may have a ring-shaped layout. In yet further embodiments, the second isolation structure 112 may be concentric about the center point of the BJT 100.

A base region 114 may be disposed within the semiconductor substrate 102 and separated from the collector region 110 by a third isolation structure 116. The base region 114 comprises the first conductivity type (e.g., n-type or p-type) and has a third doping concentration. In some embodiments, the base region 114 may have a ring-shaped layout. In further embodiments, the base region 114 may be concentric about a center point of the BJT 100. In yet further embodiments, a plurality of contacts 106 configured to provide a voltage to the base region 114 may be disposed over and coupled to the base region 114.

In some embodiments, the third isolation structure 116 may be disposed within the semiconductor substrate 102 and arranged between the base region 114 and the collector region 110. The third isolation structure 116 may be a STI region or a DTI region. In further embodiments, the third isolation structure 116 may have a ring-shaped layout. In yet further embodiments, the third isolation structure 116 may be concentric about the center point of the BJT 100.

An emitter region 118 may be disposed within the semiconductor substrate 102 and arranged within the base region 114. The emitter region 118 comprises the second conductivity type (e.g., n-type or p-type) and has a fourth doping concentration. The emitter region 118 may have a polygonal-shaped layout (e.g., square, rectangle, etc.). In some embodiments, the emitter region 118 may be concentric about a center point of the BJT 100. In further embodiments, a plurality of contacts 106 configured to provide a voltage to the emitter region 118 may be disposed over and coupled to the emitter region 118. In yet further embodiments, the emitter region 118 may contact the base region 114. In other embodiments, the emitter region 118 may be separated from the base region 114 by a non-zero distance and/or a fourth isolation structure (not shown).

A pre-metal dielectric layer 120 may be disposed over an upper surface of the semiconductor substrate 102. In some embodiments, the pre-metal dielectric layer 120 may cover an entire upper surface of the semiconductor substrate 102. The pre-metal dielectric layer may, for example, be phosphosilicate glass (PSG), borophosphosilicate glass (BPSG), silicon dioxide ($SiO_2$), some other suitable dielectric, or a combination of the foregoing. For clarity in FIG. 1, the pre-metal dielectric layer 120 is shown in phantom.

Dishing prevention columns 122 are disposed within the pre-metal dielectric layer 120 and arranged over the BJT 100. Each of the dishing prevention columns 122 may comprise a dummy gate 124. In some embodiments, the dummy gates 124 comprise a conductive material (e.g., aluminum, polysilicon, fully silicide material, tantalum (Ta), tantalum nitride (TaN), niobium (Nb), tungsten nitride (WN), etc.). In further embodiments, the dummy gates 124 are electrically floating (e.g., a voltage is not applied to the dummy gates 124). Because the dishing prevention columns 122 are disposed within the pre-metal dielectric layer 120, during a subsequent chemical-mechanical planarization (CMP) process, the dishing prevention columns may act as structural support for the pre-metal dielectric layer 120. By arranging the dishing prevention columns 122 over the BJT 100, the dishing prevention columns 122 may protect the BJT 100 from the adverse effects (e.g., decreased device performance, improperly functioning devices, etc.) of dishing caused by the CMP process. Thus, when a CMP process is performed that removes portions of the pre-metal dielectric layer 120, the dishing prevention columns 122 may reduce the amount of dishing that occurs over the BJT 100.

A first plurality of dishing prevention columns 126 may be arranged over the first isolation structure 108 in a predefined pattern. In some embodiments, a second plurality of dishing prevention columns 128 may be arranged over the second isolation structure 112 in a predefined pattern. In further embodiments, a third plurality of dishing prevention columns 130 may be arranged over the third isolation structure 116 in a predefined pattern. In yet further embodiments, a fourth plurality of dishing prevention columns 132 may be arranged over the emitter region 118 in a predefined pattern. By arranging the dishing prevention columns 122 in predefined patterns over the entirety of the BJT 100, dishing may be reduced.

A ring-shaped dishing prevention structure 134 may be disposed within the pre-metal dielectric layer 120 and arranged over the emitter region 118. In some embodiments, the ring-shaped dishing prevention structure 134 may surround the fourth plurality of dishing prevention columns 132. In further embodiments, the ring-shaped dishing prevention structure 134 may be disposed completely within the perimeter of the emitter region 118. The ring-shaped dishing prevention structure 134 may include a ring-shaped gate 136 that comprises a conductive material (e.g., aluminum, polysilicon, fully silicide material, Ta, TaN, Nb, WN, etc.). In yet further embodiments, the ring-shaped gate 136 is electrically floating (e.g., a voltage is not applied to the ring-shaped dishing prevention structure 134). In other embodiments, a contacts 106 (not shown) configured to provide a voltage to the ring-shaped gate 136 may be disposed over and coupled to the ring-shaped gate 136. Because of the layout of the ring-shaped dishing prevention structure 134, the ring-shaped dishing prevention structure 134 may provide additional lateral support to the pre-metal dielectric layer 120 during a CMP process to help limit dishing.

Sidewall spacers 138 may be arranged along sidewalls of each of the dishing prevention columns 122. In some embodiments, a sidewall spacer 138 may completely enclose the dummy gate 124. In further embodiments, a sidewall spacer 138 may be arranged along the ring-shaped dishing prevention structure 134. In yet further embodiments, the sidewall spacer 138 may completely enclose the ring-shaped gate 136. The sidewall spacers 138 may, for example, be silicon nitride, silicon dioxide, some other dielectric, or a combination of the foregoing. The formation process of the sidewall spacers 138 may be incorporated into a process that is being performed on the IC to form other features (e.g., sidewall spacers on active devices in other regions of the IC) of the IC. Further yet, the formation process of the dishing prevention columns 122 and the ring-shaped dishing prevention structure 134 may also be incorporated into a process that is being performed on the IC to form other features (e.g., gate structures of active devices in other regions of the IC) of the IC. Accordingly, the cost of manufacturing ICs may be reduced by reducing the amount of dishing that occurs over the BJT 100 without increasing the amount of process steps required to form the dishing prevention columns 122, the ring-shaped dishing prevention structure 134, or the sidewall spacers 138.

Figure 2:
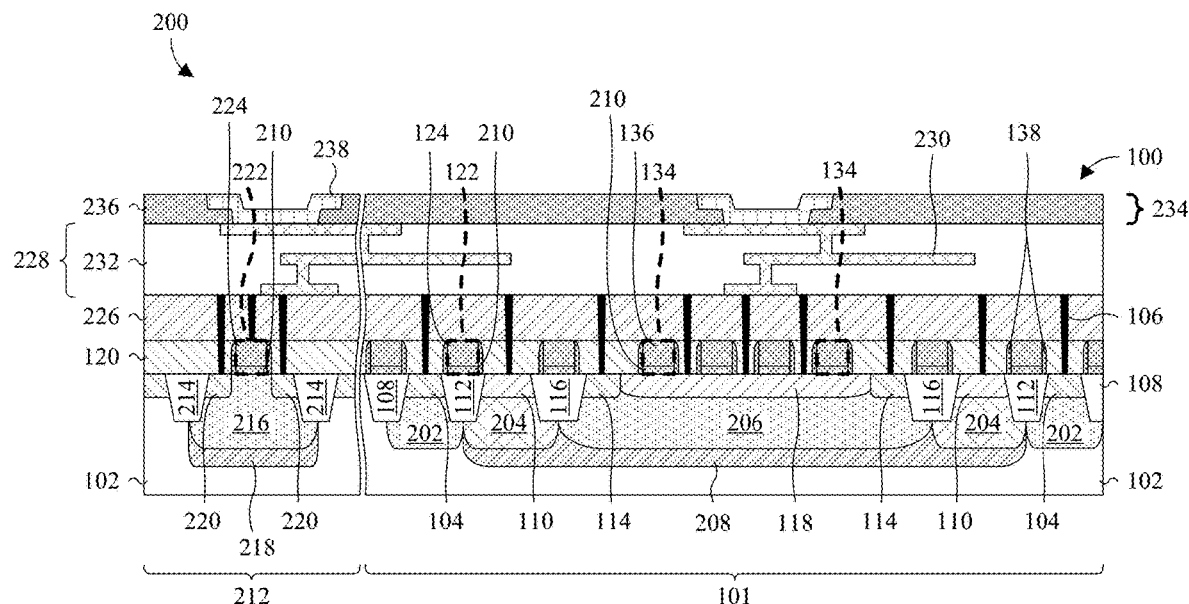
FIG. 2 illustrates a cross-sectional view of some embodiments of an integrated circuit comprising a bipolar junction transistor having a plurality of dishing prevention columns.

FIG. 2 illustrates a cross-sectional view of some embodiments of an integrated circuit comprising a bipolar junction transistor having a plurality of dishing prevention columns.

As illustrated by FIG. 2, the BJT 100 is disposed within a first IC region 101 of an integrated circuit (IC) 200. The BJT 100 comprises a first well region 202 that is disposed within the semiconductor substrate 102. The first well region 202 may comprise the first conductivity type (e.g., n-type or p-type) having a fifth doping concentration. In some embodiments, the fifth doping concentration may be less than the first doping concentration. In further embodiments, the first well region 202 may have a ring-shaped layout that underlies the substrate isolation region 104. The first well region 202 may extend under a portion of the first isolation structure 108 and a portion of the second isolation structure 112. In yet further embodiments, the first well region 202 may be concentric about a center point of the BJT 100. In some embodiments, the first well region 202 may be a high-voltage well region.

The BJT 100 comprises a second well region 204 that is disposed within the semiconductor substrate 102. The second well region 204 may comprise the second conductivity type (e.g., n-type or p-type) having a sixth doping concentration. In some embodiments, the sixth doping concentration may be less than the second doping concentration. In further embodiments, the second well region 204 may have a ring-shaped layout that underlies the collector region 110. The second well region 204 may extend under a portion of the second isolation structure 112 and contact the first well region 202 on a first side to form a first p-n junction, and may extend under a portion of the third isolation structure 116. In yet further embodiments, the second well region 204 may be concentric about a center point of the BJT 100. In some embodiments, the second well region 204 may be a high-voltage well region.

The BJT 100 comprises a third well region 206 that is disposed within the semiconductor substrate 102. The third well region 206 may comprise the first conductivity type (e.g., n-type or p-type) having a seventh doping concentration. In some embodiments, the seventh doping concentration may be less than the third doping concentration. In further embodiments, the third well region 206 may extend below a portion of the third isolation structure 116 and contact the second well region 204 to form a second p-n junction, and may extend completely under the base region 114 and the emitter region 118. In yet further embodiments, the third well region 206 may be concentric about a center point of the BJT 100. In some embodiments, the third well region 206 may be a high-voltage well region.

In some embodiments, the BJT 100 may comprise a first deep well region 208 that is disposed within the semiconductor substrate 102 and below the second well region 204, the third well region 206, and the emitter region 118. The first deep well region 208 may comprise the second conductivity type (e.g., n-type or p-type) having an eighth doping concentration. In further embodiments, the first deep well region 208 may extend completely below the second well region 204 and the third well region 206. In yet further embodiments, because the first deep well region 208 comprises the second conductivity type and extends below the third well region 206, the second p-n junction also extends along a region of the semiconductor substrate 102 in which the third well region 206 and the first deep well region 208 contact.

In some embodiments, each of the dishing prevention columns 122 further comprise a first gate oxide layer 210. The first gate oxide layer 210 separates the dummy gate 124 from an upper surface of the semiconductor substrate 102. In some embodiments, the ring-shaped dishing prevention structure 134 further comprises the first gate oxide layer 210 separating the ring-shaped gate 136 from the upper surface of the semiconductor substrate 102. The first gate oxide layer 210 may, for example, be $SiO_2$, a high-k dielectric, or some other dielectric. In some embodiments, the sidewall spacers 138 extend along sidewalls of the first gate oxide layers 210 and contact the upper surface of the semiconductor substrate 102.

The IC 200 further comprises a second IC region 212. The second IC region 212 may comprise a plurality of active and passive semiconductor devices. For example, the second IC region 212 may comprise a first semiconductor device (e.g., a metal-oxide-semiconductor field-effect transistor (MOSFET). The first semiconductor device may be surrounded by a fifth isolation structure 214. In some embodiments, the fifth isolation structure 214 may have a ring-shaped layout. In further embodiments, the fifth isolation structure 214 may be a STI region or a DTI region.

A fourth well region 216 may be disposed within the semiconductor substrate 102 and arranged within the fifth isolation structure 214. In some embodiments, the fourth well region 216 comprises the second conductivity type (e.g., n-type or p-type) having a ninth doping concentration. In further embodiments, the ninth doping concentration is substantially the same as the sixth doping type. In yet further embodiments, the fourth well region 216 extends below a portion of the fifth isolation structure 214. In some further embodiments, a second deep well region 218 may be disposed within the semiconductor substrate 102 and arranged below the fourth well region 216. The second deep well 218 may comprise the first conductivity (e.g., n-type or p-type) having a tenth doping concentration. In some embodiments, the second deep well 218 may extend completely below the fourth well region 216.

A pair of source/drain regions 220 is disposed within the semiconductor substrate 102 and arranged within the fourth well region 216. In some embodiments, the source/drain regions 220 comprise the first conductivity type (e.g., n-type or p-type) having an eleventh doping concentration. In other embodiments, the source/drain regions 220 comprise the second conductivity type (e.g., n-type or p-type) having a twelfth doping concentration. Individual contacts 106 configured to provide independent voltages to each of the source/drain regions 220 may be respectively disposed over and coupled to each of the source/drain regions 220.

A first gate stack 222 is disposed within the pre-metal dielectric layer 120 and arranged between a pair of source/drain regions 220. The first gate stack 222 may comprise a first gate electrode 224 that is separated from the upper surface of the semiconductor substrate 102 by the first gate oxide layer 210. The first gate electrode 224 may comprise a conductive material (e.g., aluminum, polysilicon, fully silicide material, Ta, TaN, Nb, WN, etc.). In some embodiments, the conductive material of the first gate electrode 224 is the same conductive material as the conductive material in the dummy gates 124 and the ring-shaped gate 136. In further embodiments, an upper surface of the first gate electrode 224 has an area that is substantially the same as an area of an upper surface of the dummy gate 124. In further embodiments, the first gate electrode 224 has a height that is substantially the same as a height of the dummy gate 124. In yet further embodiments, the first gate oxide layer 210 has a height that is substantially the same in the first gate stack 222, the dishing prevention columns 122, and the ring-shaped dishing prevention structure 134. A contacts 106 configured to provide a voltage to the first gate electrode 224 may be disposed over and coupled to the first gate electrode 224.

In some embodiments, a first inter-metal dielectric (IMD) layer 226 is disposed over the pre-metal dielectric layer 120. The first IMD layer 226 may comprise, for example, one or more layers of an oxide, a low-k dielectric, or an ultra-low-k dielectric. In some embodiments, the first IMD layer 226 may extend completely over the entirety of the IC 200. The first IMD layer 226 may separate the pre-metal dielectric layer 120 from an interconnect structure 228, and the contacts 106 may extend through the first IMD layer 226 to the interconnect structure 228.

In some embodiments, the interconnect structure 228 may comprise a plurality of conductive features 230 (e.g., conductive line(s) conductive via(s), contact pad(s), etc.) formed within an inter-layer dielectric (ILD) layer 232. In some embodiments, the contacts 106 extend through the IMD layer 226 and are coupled to various conductive features 230. The conductive features may comprise a metal, such as copper, aluminum, gold, silver, or other suitable metal. In some embodiments, the ILD layer 232 may comprise one or more layers of $SiO_2$, or some other suitable oxide (e.g., a low-k dielectric material).

An under-bump metallization (UBM) stack 234 may be arranged over the interconnect structure 228. In some embodiments, the UBM stack 234 comprises a passivation layer 236 and a UBM layer 238. In some embodiments, the passivation layer 236 comprises one or more layers of $SiO_2$, silicon nitride ($Si_3N_4$), polyimide compounds, or other suitable materials. The UBM layer 238 may contact an upper conductive feature (e.g., a contact pad) of the interconnect structure 228. The UBM layer 238 may comprise, for example, aluminum, titanium, tungsten, or some other suitable material. The UBM layer 238 is configured to provide an interface between an overlying solder bump (not shown) and an underlying conductive feature (e.g., a contact pad or a conductive trace) of the interconnect structure 228.

Figure 3:
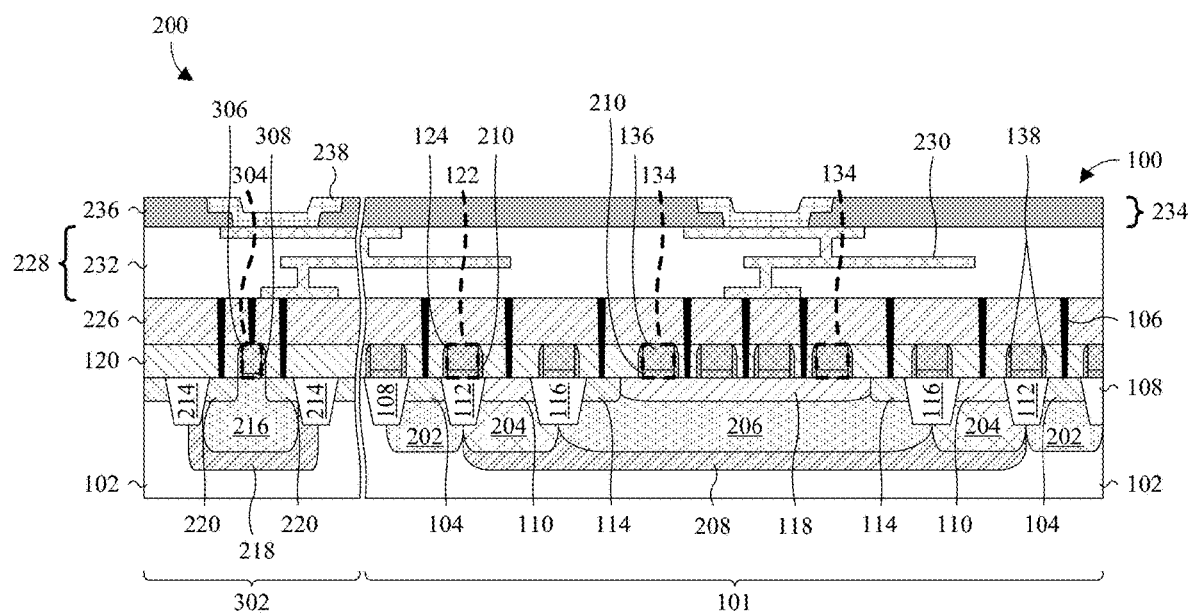
FIG. 3 illustrates a cross-sectional view of some other embodiments of an integrated circuit comprising a bipolar junction transistor having a plurality of dishing prevention columns.

FIG. 3 illustrates a cross-sectional view of some other embodiments of an integrated circuit comprising a bipolar junction transistor having a plurality of dishing prevention columns.

In some embodiments, the IC 200 comprises a third IC region 302. The third IC region 302 may comprise a second gate stack 304 that is disposed within the pre-metal dielectric layer 120 and arranged between a pair of source/drain regions 220. The second gate stack 304 may comprise a second gate electrode 306 that is separated from the upper surface of the semiconductor substrate 102 by the second gate oxide layer 308. The second gate electrode 306 may comprise a conductive material (e.g., aluminum, polysilicon, fully silicide material, Ta, TaN, Nb, WN, etc.). In some embodiments, the conductive material of the second gate electrode 306 is different than the conductive material of the dummy gates 124 and the ring-shaped gate 136. In further embodiments, an upper surface of the second gate electrode 306 has an area that is different than an area of an upper surface of the dummy gate 124. In further embodiments, the second gate electrode 306 has a height that different than a height of the dummy gate 124. In yet further embodiments, the second gate oxide layer 308 has a height that is different than first gate oxide layer 210.

FIGS. 4-15 illustrate a series of views of a method for forming an integrated circuit comprising a bipolar junction transistor having a plurality of dishing prevention columns.

Figure 4:
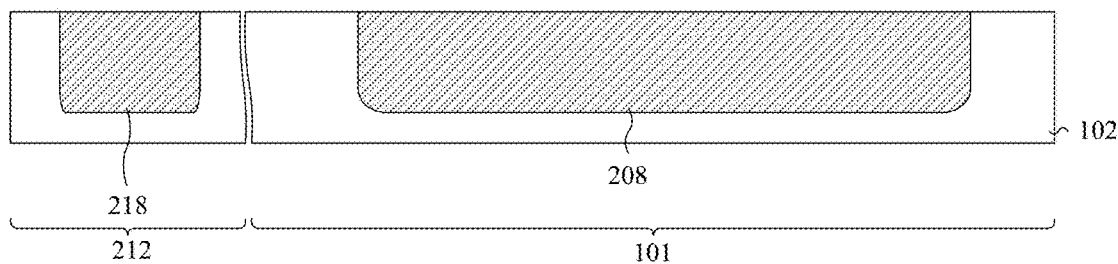
FIGS. 4-15 illustrate a series of views of a method for forming an integrated circuit comprising a bipolar junction transistor having a plurality of dishing prevention columns.

As illustrated by FIG. 4, a first deep well 208 and a second deep well 218 are formed within the semiconductor substrate 102. In some embodiments, the first deep well 208 is formed within a first IC region 101, and the second deep well 218 is formed within the second IC region. In further embodiments, the first deep well 208 and the second deep well 218 may comprise the same conductive type. The first deep well 208 and the second deep well 218 may, for example, be formed by one or more ion implantation processes and may, for example, utilize one or more photoresist layers to selectively implant ions into the semiconductor substrate 102 in a desired layout.

Figure 5:
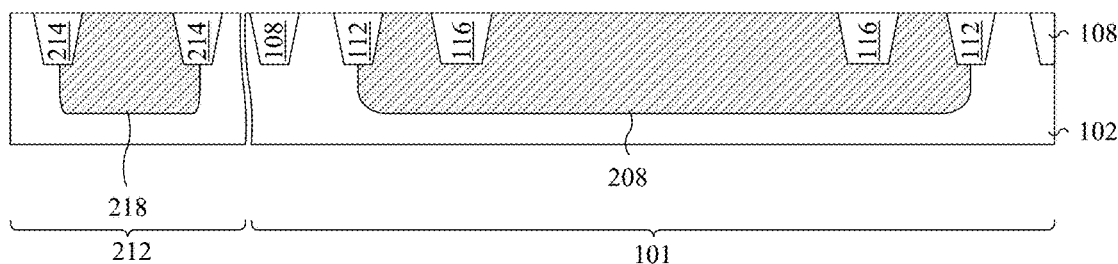

As illustrated by FIG. 5, a first isolation structure 108, a second isolation structure 112, a third isolation structure 116, and a fifth isolation structure 214 (collectively "isolation structures 108/112/116/214") are formed within the semiconductor substrate 102. In some embodiments, the first isolation structure 108, second isolation structure 112, and the third isolation structure 116 may be formed in the first IC region 101. In further embodiments, the fifth isolation structure 214 may be formed within the second IC region 212. In yet further embodiments, the isolation structures may be an STI region or a DTI region.

In some embodiments, a process for forming the isolation structures 108/112/116/214 comprises performing one or more etches that may utilize one or more photoresist layers to selectively form trenches in the semiconductor substrate 102. Subsequently, the trenches may be filled with a dielectric material. The trenches may, for example, be formed with the desired layouts of the isolation structures 108/112/116/214, and/or the dielectric material may be, for example, $SiO_2$.

Figure 6:
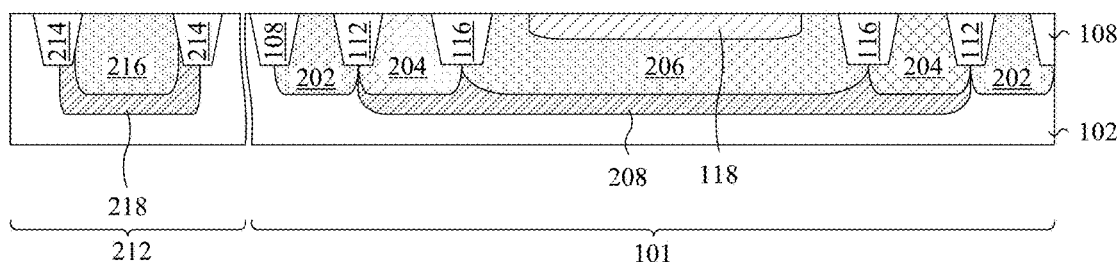

As illustrated by FIG. 6, a first well region 202, a second well region 204, a third well region 206, a fourth well region 216, and an emitter region 118 are formed within the semiconductor substrate 102. In some embodiments, the first well region 202, the second well region 204, the third well region 206, and the emitter region 118 may be formed within the first IC region 101. In further embodiments, the fourth well region 216 may be formed in the second IC region 212. In yet further embodiments, the first well region 202, the third well region 206, and the fourth well region 216 may comprise a first conductivity type (e.g., n-type or p-type), while the emitter region 118 and the second well region 204 comprise a second conductivity (e.g., n-type or p-type) that is different than the first conductivity type.

In some embodiments, a process for forming the first well region 202, the second well region 204, the third well region 206, the fourth well region 216, and the emitter region 118 comprises performing one or more ion implantation processes and may, for example, utilize one or more photoresist layers to selectively implant ions into the semiconductor substrate 102 in a desired layout. In further embodiments, the first well region 202, the third well region 206, and the fourth well region 216 may be formed by a first ion implantation process. In yet further embodiments, the emitter region 118 and the second well region 204 may be formed by a second ion implantation process.

Figure 7:
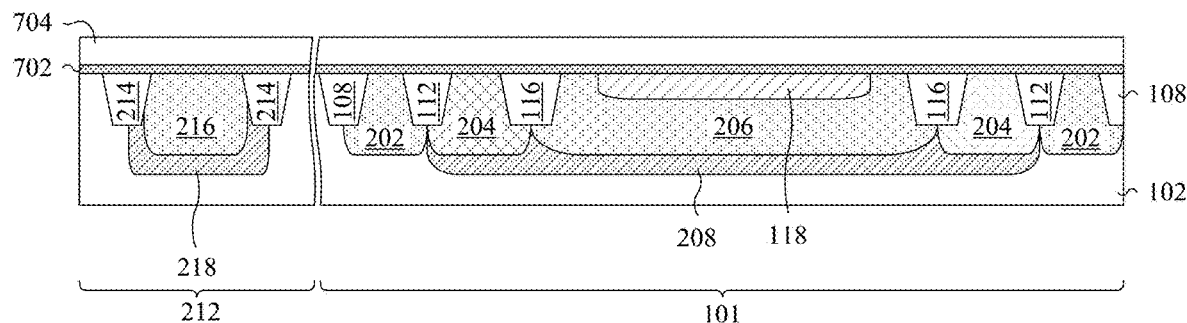

As illustrated by FIG. 7, a dielectric layer 702 and a conductive layer 704 are formed over the semiconductor substrate 102 and cover the first IC region 101 and the second IC region 212, such that the conductive layer 704 overlies the dielectric layer 702. The dielectric layer 702 may, for example, be silicon dioxide, a low-k dielectric, or some other dielectric, and/or the conductive layer 704 may be, for example, doped polysilicon, metal, or some other conductive material. In other embodiments, the conductive layer 704 is polysilicon that undergoes a subsequent doping process by, for example, ion implantation.

In some embodiments, a process for forming the dielectric layer 702 and the conductive layer 704 comprises depositing or growing the dielectric layer 702 in the first IC region 101 and the second IC region 212 on an upper surface of the semiconductor substrate 102, and subsequently depositing or growing the conductive layer 704 on the dielectric layer 702. The dielectric layer 702 may, for example, be deposited or grown by thermal oxidation, chemical vapor deposition (CVD), physical vapor deposition (PVD), sputtering, or some other deposition or growth process. The conductive layer 704 may, for example, be deposited or grown by CVD, PVD, sputtering, electrochemical plating, electroless plating, or some other deposition or growth process.

Figure 8:
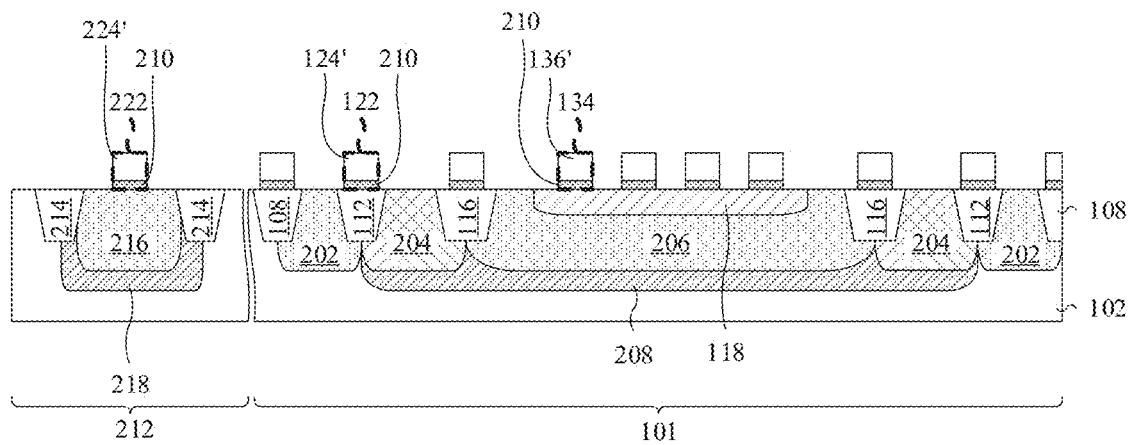

As illustrated by FIG. 8, the conductive layer 704 (see FIG. 7) and the dielectric layer 702 (see FIG. 7) are patterned to form dishing prevention columns 122 and a ring-shaped dishing prevention structure 134 over the first IC region 101, and a first gate stack 222 over the second IC region 212. In some embodiments, the dishing prevention columns 122 may comprise a first gate oxide layer 210 separating a dummy gate 124' from the upper surface of the semiconductor substrate 102. The ring-shaped dishing prevention structure 134 may comprise a ring-shaped gate 136' that is separated from the upper surface of the semiconductor substrate 102 by the gate oxide layer. In further embodiments, the first gate stack 222 may comprise a first gate electrode 224' separated from the upper surface of the semiconductor substrate 102 by the first gate oxide layer 210. In yet further embodiments, the apostrophe marks in FIGS. 8-11 indicate that the dummy gate 124', the ring-shaped gate 136', and the first gate electrode 224' comprise an intermediate material (e.g., polysilicon) that may undergo a subsequent process (e.g., poly-gate replacement (RPG) high-k metal gate (HKMG) process, a fully silicided (FUSI) process, etc.) step that alters the composition of the intermediate material.

In some embodiments, a process for patterning the conductive layer 704 and the dielectric layer 702 into the dishing prevention columns 122, the ring-shaped dishing prevention structure 134, and the first gate stack 222 comprises forming a patterned photoresist layer (not shown) on the conductive layer 704. The patterned photoresist layer may, for example, be formed by a spin on process. The patterned photoresist layer may, for example, be patterned with a layout of the dishing prevention columns 122, the ring-shaped dishing prevention structure 134, and the first gate stack 222 and may, for example, be patterned using photolithography. Further, in some embodiments, the process comprises performing an etch into the conductive layer 704 and the dielectric layer 702 with the patterned photoresist layer in place, and subsequently stripping the patterned photoresist layer. In yet further embodiments, multiple etches and multiple photoresist layers may be used to form the dishing prevention columns 122, the ring-shaped dishing prevention structure 134, and the first gate stack 222.

Figure 9:
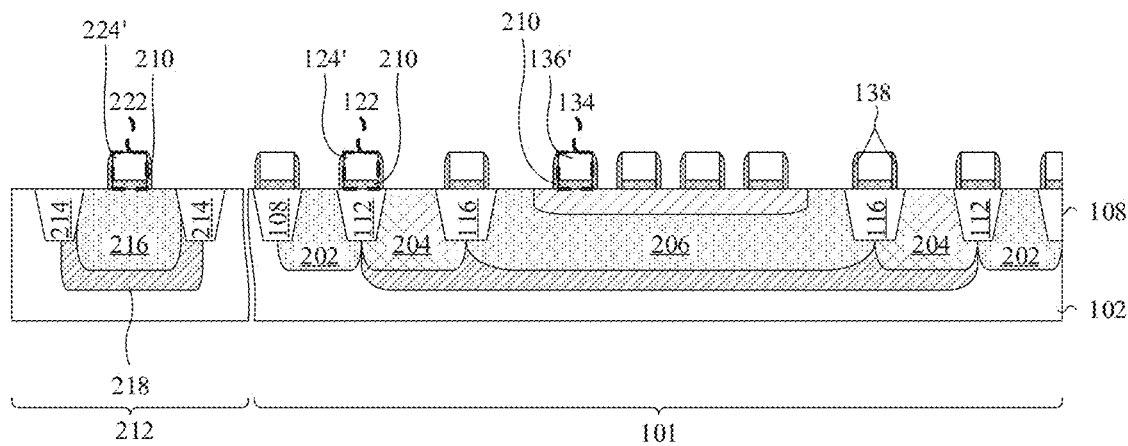

As illustrated by FIG. 9, sidewall spacers 138 are formed along sidewalls of each of the dishing prevention columns 122, the ring-shaped dishing prevention structure 134, and the first gate stack 222. In some embodiments, the sidewall spacers 138 may, for example, comprise silicon nitride, silicon dioxide, some other dielectric, or a combination of the foregoing. In further embodiments, a process for forming the sidewall spacers 138 comprises depositing or growing a spacer layer covering and conformally lining the structure in FIG. 8. The sidewall spacer layer may, for example, be deposited or grown by chemical or physical vapor deposition, sputtering, or some other deposition or growth process. In yet further embodiments, the process comprises performing an etch back into the spacer layer to remove horizontal segments of the spacer layer without removing vertical segments of the spacer layer. In some embodiments, multiple etches and multiple photoresist layers may be used to form the sidewalls spacers 138.

Figure 10:
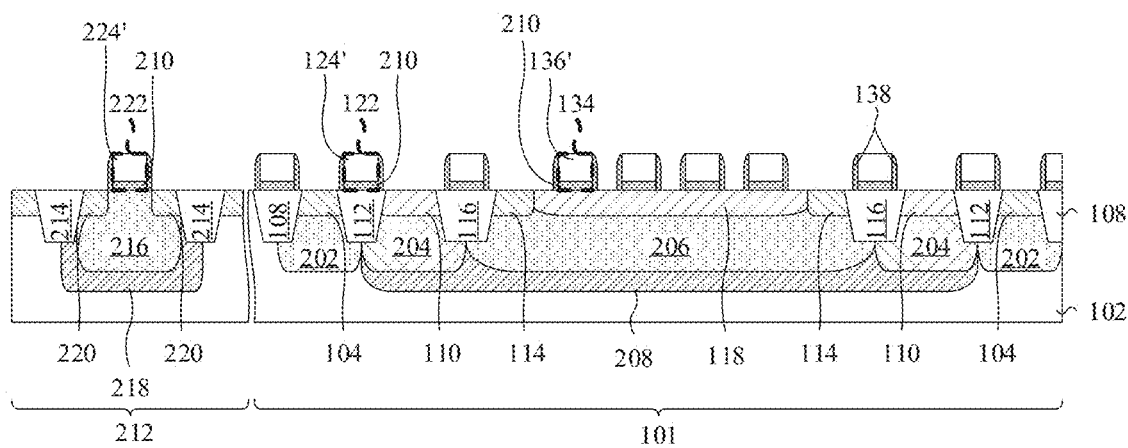

As illustrated by FIG. 10, a pair of source/drain regions 220 are formed in the semiconductor substrate 102 within the second IC region 212, and a substrate isolation region 104, a collector region 110, and a base region 114 are formed in the semiconductor substrate 102 within the first IC region 101. In some embodiments, the substrate isolation region 104 comprises a same conductivity type (e.g., n-type or p-type) as the first well region 202 and has a higher doping concentration than the first well region 202. In further embodiments, the collector region 110 comprises a same conductivity type (e.g., n-type or p-type) as the second well region 204 and has a higher doping concentration than the second well region 204. In yet further embodiments, the base region 114 comprises a same conductivity type (e.g., n-type or p-type) as the third well region 206 and has a higher doping concentration than the third well region 206. In some embodiments, the pair of source/drain regions 220 comprises the same conductivity type as the fourth well region 216 and has a higher doping concentration than the fourth well region 216. In yet other embodiments, the pair of source/drain regions 220 comprises a different conductivity than the fourth well region 216.

In some embodiments, a process for forming the source/drain regions 220, the substrate isolation region 104, the collector region 110, and the base region 114 comprises forming multiple patterned photoresist layers (not shown) on the structure in FIG. 9 and subsequently performing multiple ion implantation processes. The patterned photoresist layer may, for example, be formed by a spin on process. One of the patterned photoresist layers (not shown) may, for example, be patterned with a layout covering the second well region 204 (and any overlying features) and the emitter region 118 (and any overlying features). A first ion implantation process may be performed with the one of the patterned photoresist layers in place. A second one of the patterned photoresist layers (not shown) may, for example, be patterned with a layout covering the first well region 202 (and any overlying features), the third well region 206 (and any overlying features), the emitter region 118 (and any overlying features), and the fourth well region 216 (and any overlying features). A second ion implantation process may be performed with the second one of the patterned photoresist layers in place.

Figure 11:
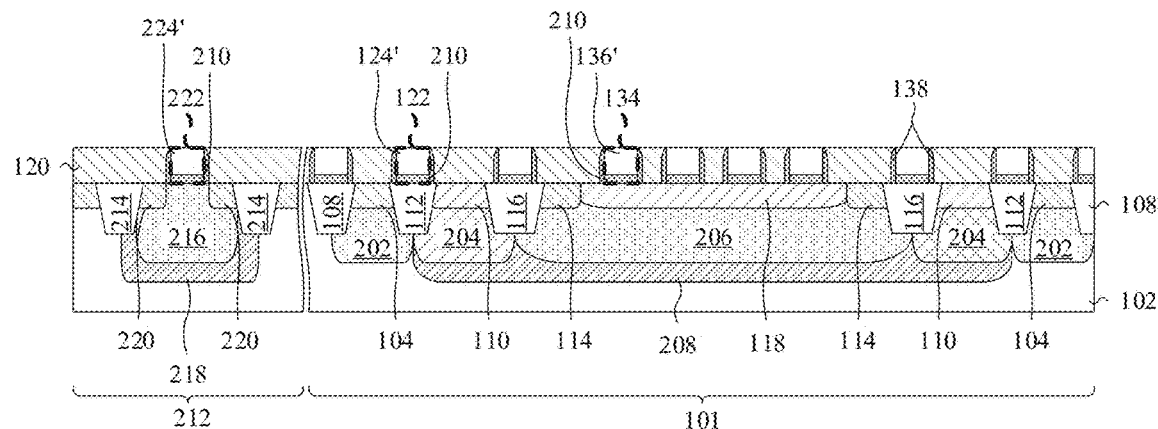

As illustrated by FIG. 11, a pre-metal dielectric layer 120 is formed covering the structure of FIG. 10, and a planarization of the pre-metal dielectric layer 120 is subsequently performed. The pre-metal dielectric layer 120 may, for example, be formed with a planar top surface, and/or may, for example, be formed of oxide, nitride, a low-k dielectric, some other dielectric, or a combination of the foregoing. In some embodiments, the pre-metal dielectric layer 120 may, for example, be formed by chemical vapor deposition (CVD), physical vapor deposition (PVD), sputtering, some other deposition or growth process, or a combination of the foregoing. The planarization may, for example, be performed by a CMP process. As stated above, because the dishing prevention columns 122 and the ring-shaped dishing prevention structure 134 are formed in the pre-metal dielectric layer 120, the dishing caused during the CMP process can be reduced, which may increase device performance and reduce the cost to manufacture ICs. In some embodiments, the planarization process reduces the height of the ring-shaped gate 136, the dummy gates 124, and the first gate electrode 224. Accordingly, a top surface of the ring-shaped gate 136, the dummy gates 124, and the first gate electrode 224 are co-planar with a top surface of the pre-metal dielectric layer 120.

Figure 12:
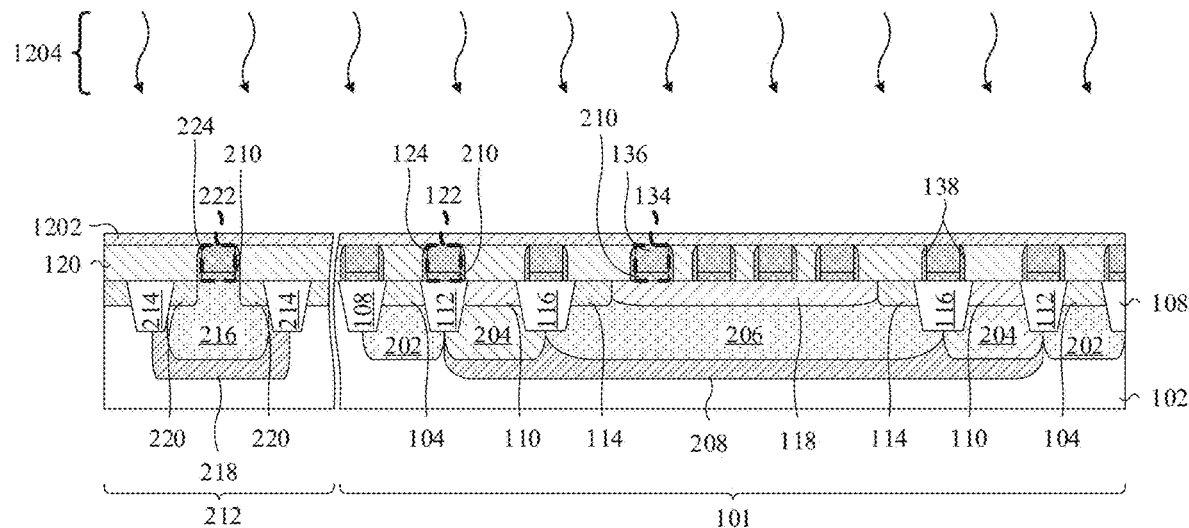

As illustrated by FIG. 12, a transition metal layer 1202 is formed covering the structure of FIG. 11, and subsequently performing an anneal process 1204 with the transition metal layer 1202 in place to fully silicide the dummy gates 124, the ring-shaped gate 136, and the first gate electrode 224. In some embodiments, the transition metal layer 1202 may, for example, comprise nickel, titanium, cobalt, platinum, tungsten, or some other transition metal. In some embodiments, the transition metal layer 1202 may, for example, be formed by CVD, PVD, sputtering, some other deposition or growth process, or a combination of the foregoing. The anneal process 1204 is performed at a temperature and for a time that is adequate for the dummy gates 124, the ring-shaped gate 136, and the first gate electrode 224 to be fully silicided. Further, in some embodiments, the process comprises removing unreacted material of the transition metal layer 1202 by an etch and/or a CMP process. In further embodiments, because the dummy gate 124, the ring-shaped gate 136, and the first gate electrode 224 are not illustrated with an apostrophe, the dummy gate 124, the ring-shaped gate 136, and the first gate electrode 224 may comprise a fully silicided material. In yet further embodiments, the first gate electrode 224 may undergo a RPG HKMG process while the dummy gates 124 and the ring-shaped gate 136 may undergo the FUSI process.

Figure 13:
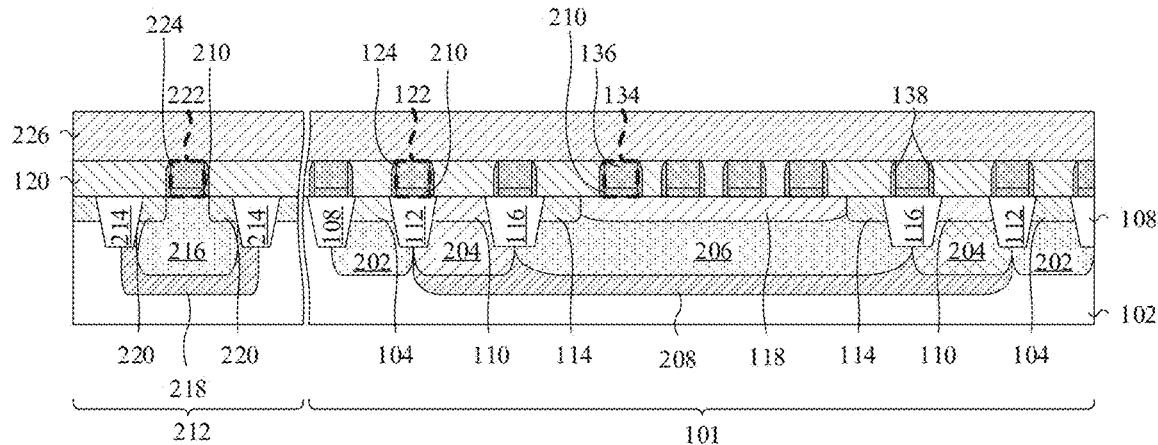

As illustrated by FIG. 13, a first inter-metal dielectric (IMD) layer 226 is formed covering the structure of FIG. 12 with the transition metal layer 1202 removed. The first IMD layer 226 may, for example, be formed with a planar top surface, and/or may, for example, be formed of oxide, nitride, a low-k dielectric, some other dielectric, or a combination of the foregoing. In some embodiments, the first IMD layer 226 may, for example, be formed by CVD, PVD, sputtering, some other deposition or growth process, or a combination of the foregoing. In further embodiments, a planarization process (e.g., a CMP) may be performed on the first IMD layer 226 to form a substantially planar upper surface.

Figure 14:
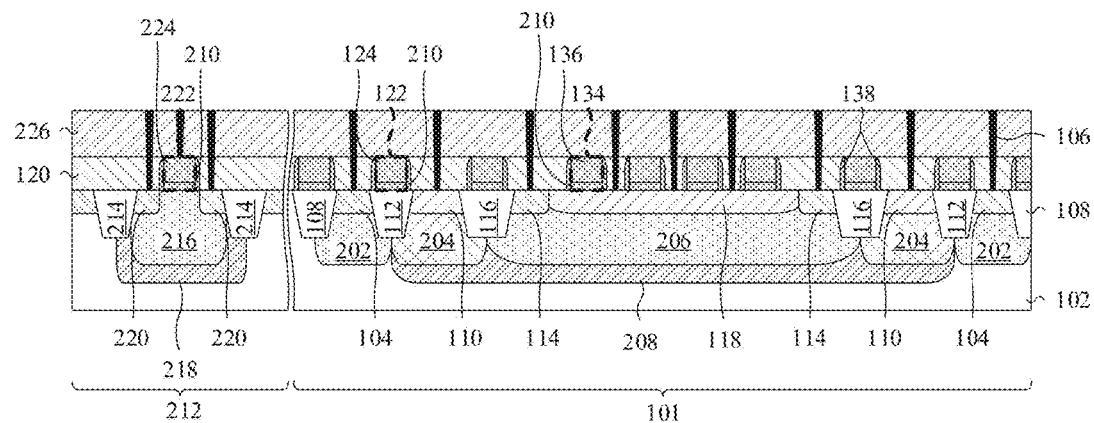

As illustrated by FIG. 14, contacts 106 are formed extending through the first IMD layer 226 and the pre-metal dielectric layer 120 to the emitter region 118, the base region 114, the collector region 110, and the substrate isolation region 104. In some embodiments, contacts 106 are also formed that extend through the first IMD layer 226 and the pre-metal dielectric layer 120 to the ring-shaped gate 136. In further embodiments, contacts 106 are not formed that they contact a dummy gate 124.

In some embodiments, a process for forming the contacts 106 comprises performing an etch into the first IMD layer 226 and the pre-metal dielectric layer 120 to form contact-via openings corresponding to the contacts 106. The etch may be, for example, performed using photolithography. Further, in some embodiments, the process comprises filling the contact-via openings with a conductive material. The contact-via openings may, for example, be filled by depositing or growing a conductive layer covering the first IMD layer 226 and filling the contact-via openings, and subsequently performing a planarization on the first IMD layer 226. The planarization may, for example, be performed by CMP. The process may, for example, be part of a single damascene like process or a dual damascene like process.

Figure 15:
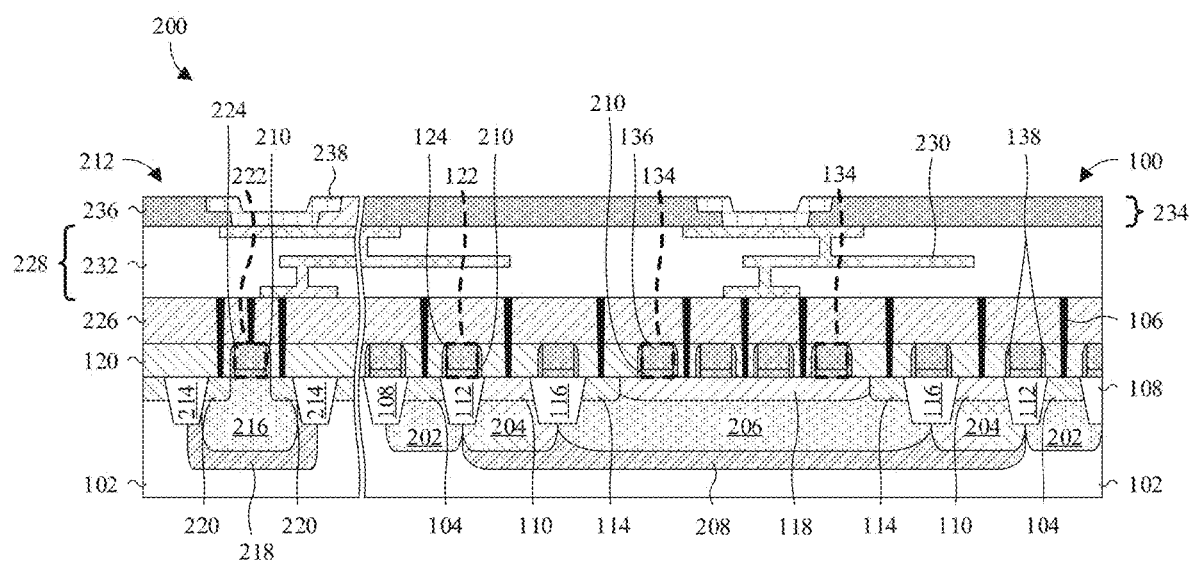

As illustrated by FIG. 15, an interconnect structure 228 having a plurality of conductive features 230 (e.g., conductive line(s) conductive via(s), contact pad(s), etc.) disposed within an inter-layer dielectric (ILD) layer 232 is formed over the first IMD layer 226. In some embodiments, the ILD layer 232 may, for example, be formed with a planar top surface, and/or may, for example, be formed of oxide, nitride, a low-k dielectric, some other dielectric, or a combination of the foregoing. In further embodiments, the ILD layer 232 may, for example, be formed by CVD, PVD, sputtering, some other deposition or growth process, or a combination of the foregoing. The conductive features 230 may be formed in the ILD layer 232, for example, by performing one or more etches with one or more photoresist layers in place, and subsequently filing the trenches formed by the one or more etches with a conductive material.

In yet further embodiments, an under-bump metallization (UBM) stack having a passivation layer 236 and a UBM layer 238 is formed over the interconnect structure 228. In some embodiments, the passivation layer 236 comprises one or more layers of $SiO_2$, silicon nitride ($Si_3N_4$), polyimide compounds, or other suitable materials. In further embodiments, the passivation layer 236 may, for example, be formed by CVD, PVD, sputtering, some other deposition or growth process, or a combination of the foregoing. The UBM layer 238 may be formed within the passivation layer 236, for example, by performing one or more etches with one or more photoresist layers in place, and subsequently forming a conductive layer over the patterned passivation layer 236. In some embodiments, the UBM layer may comprise, for example, aluminum, titanium, tungsten, or some other suitable material.

Figure 16:
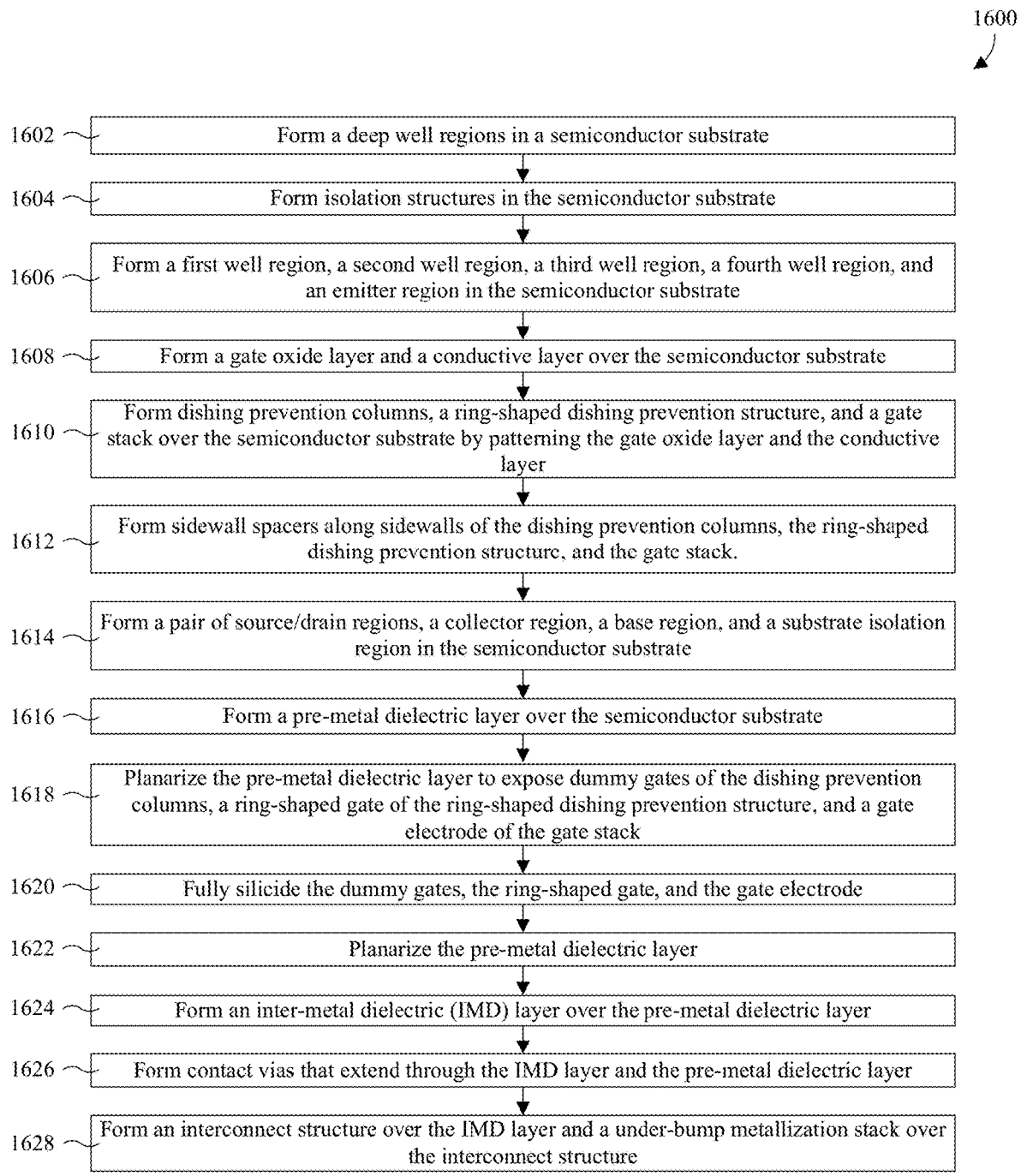
FIG. 16 illustrates a flowchart of some embodiments of a method of forming an integrated circuit comprising a bipolar junction transistor having a plurality of dishing prevention columns.

With reference to FIG. 16, a flowchart 1600 of some embodiments of a method for forming an integrated circuit comprising a bipolar junction transistor having a plurality of dishing prevention columns. While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1602, deep well regions are formed in the semiconductor substrate. See, for example, FIG. 4.

At 1604, isolation structures are formed in the semiconductor substrate. See, for example, FIG. 5.

At 1606, a first well region, a second well region, a third well region, a fourth well region, and an emitter region are formed in the semiconductor substrate. See, for example, FIG. 6.

At 1608, a gate oxide layer and a conductive layer are formed over the semiconductor substrate. See, for example, FIG. 7.

At 1610, dishing prevention columns, a ring-shaped dishing prevention structure, and a gate stack are formed over the semiconductor substrate by patterning the gate oxide layer and the conductive layer. See, for example, FIG. 8.

At 1612, sidewall spacers are formed along sidewalls of the dishing prevention columns, the ring-shaped dishing prevention structure, and the gate stack. See, for example, FIG. 9.

At 1614, a pair of source/drain regions, a collector region, a base region, and a substrate isolation region are formed in the semiconductor substrate. See, for example, FIG. 10.

At 1616, a pre-metal dielectric layer is formed over the semiconductor substrate. See, for example, FIG. 11.

At 1618, the pre-metal dielectric layer is planarized to expose dummy gates of the dishing prevention columns, a ring-shaped gate of the ring-shaped dishing prevention structure, and a gate electrode of the gate stack. See, for example, FIG. 11.

At 1620, the dummy gates, the ring-shaped gate, and the gate electrode are fully silicided. See, for example, FIG. 12.

At 1622, the pre-metal dielectric layer is planarized. See, for example, FIG. 12.

At 1624, an inter-metal dielectric (IMD) layer is formed over the pre-metal dielectric layer. See, for example, FIG. 13.

At 1626, contacts are formed that extend through the IMD layer and the pre-metal dielectric layer. See, for example, FIG. 14.

At 1628, an interconnect structure is formed over the IMD layer and an under-bump metallization stack is formed over the interconnect structure. See, for example, FIG. 15.

Thus, as can be appreciated from above, the present disclosure relates to an improve BJT (and related method) that comprises a plurality of dishing prevention columns that can improve device performance and lower the cost to manufacture integrated circuits by prevention dishing from occurring over the BJT.

Accordingly, in some embodiments, the present application provides a bipolar junction transistor (BJT). The BJT includes a collector region that is disposed within a semiconductor substrate. A base region that is disposed within the semiconductor substrate and arranged within the collector region. An emitter region that is disposed within the semiconductor substrate and arranged within the base region. A pre-metal dielectric layer that is disposed over the semiconductor substrate and that separates the upper surface of the semiconductor substrate from a lowermost metal interconnect layer. A first plurality of dishing prevention columns are arranged over the emitter region and within the pre-metal dielectric layer, where the first plurality of dishing prevention columns each include a dummy gate that is conductive and electrically floating.

In other embodiments, the present application provides a method for forming a bipolar junction transistor (BJT). The method includes forming a collector region in a semiconductor substrate. A base region is formed in the semiconductor substrate and is arranged within the collector region. An emitter region is formed in the semiconductor substrate and is arranged within the base region. A pre-metal dielectric layer is formed over an upper-surface of the semiconductor substrate. A plurality of dummy gates are formed over the emitter region and within the pre-metal dielectric layer. A ring-shaped structure is formed over the emitter region and within the pre-metal dielectric layer, where the ring-shaped structure surrounds the plurality of dummy gates. The plurality of dummy gates and the ring-shaped structure are reacted with a transition metal, thereby forming a plurality of dishing prevention columns and a ring-shaped dishing prevention structure. A chemical-mechanical planarization (CMP) process is performed on the pre-metal dielectric layer.

In yet other embodiments, the present application provides an integrated circuit (IC). The IC includes a first IC region. The first region includes an emitter region that is disposed within a semiconductor substrate. A ring-shaped base region is disposed within the semiconductor substrate and laterally surrounds the emitter region. A pre-metal dielectric layer is disposed over an upper surface of the semiconductor substrate and separates the upper surface of the semiconductor substrate from a lowermost metal interconnect layer. A plurality of dishing prevention columns are arranged over the emitter region and within the pre-metal dielectric layer, where the plurality of dishing prevention columns each include a dummy gate that is conductive and electrically floating. Further, the IC includes a second IC region. The second IC region includes a semiconductor device having a pair of source/drain regions that is disposed within the semiconductor region, where the source/drain region are spaced apart. A gate stack is disposed over the semiconductor substrate and arranged between the source/drain regions, where the gate stack includes a first gate oxide layer that separates a gate electrode from the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit, the method comprising:
    forming a first isolation structure in a semiconductor substrate;
    forming a second isolation structure in the semiconductor substrate and laterally surrounding the first isolation structure;
    forming a third isolation structure in the semiconductor substrate and laterally surrounding the second isolation structure;
    forming an emitter region in the semiconductor substrate;
    forming a plurality of column structures over the semiconductor substrate;
    forming a collector region in the semiconductor substrate, wherein the collector region is formed laterally surrounding the emitter region and at least one of the plurality of column structures, and wherein the second isolation structure laterally surrounds the collector region;
    forming a base region in the semiconductor substrate and between the emitter region and the collector region, wherein the first isolation structure is disposed between the base region and the collector region;
    forming a first dielectric layer over the semiconductor substrate and covering the plurality of column structures, the emitter region, the collector region, and the base region; and
    after the plurality of column structures are formed, forming a plurality of conductive contacts over the semiconductor substrate and vertically extending through an upper surface of the first dielectric layer.

2. The method of claim 1, wherein forming the plurality of column structures comprises:
    forming a bate dielectric layer over the semiconductor substrate and covering the emitter region;
    forming a gate material layer on the gate dielectric layer; and
    patterning the gate material layer and the gate dielectric layer to form the plurality of column structures, wherein the first dielectric layer is formed covering the plurality of column structures after the gate material layer and the gate dielectric layer are patterned to form the plurality of column structures.

3. The method of claim 1, further comprising:
    before the first dielectric layer is formed, forming a plurality of sidewall spacer structures along sidewalls of the plurality of column structures, respectively.

4. The method of claim 1, further comprising:
    after the plurality of conductive contacts are formed, forming a lowermost conductive feature of an interconnect structure over the semiconductor substrate and the plurality of column structures, wherein one or more of the plurality of conductive contacts are electrically coupled to the lowermost conductive feature.

5. The method of claim 1, further comprising:
    forming a second dielectric layer over the first dielectric layer and the plurality of column structures, wherein the plurality of conductive contacts are formed extending vertically through both the upper surface of the first dielectric layer and an upper surface of the second dielectric layer.

6. The method of claim 5, further comprising:
    before the second dielectric layer is formed, performing a chemical-mechanical planarization (CMP) process into the first dielectric layer and the plurality of column structures.

7. The method of claim 1, wherein:
    at least one of the plurality of column structures is formed between an inner perimeter and an outer perimeter of the first isolation structure;
    at least one of the plurality of column structures is formed between an inner perimeter and an outer perimeter of the second isolation structure; and
    at least one of the plurality of column structures is formed between an inner perimeter and an outer perimeter of the third isolation structure.

8. A method for forming an integrated circuit, the method comprising:
    forming an emitter region in a semiconductor substrate;
    forming a plurality of initial column structures over the semiconductor substrate, wherein the initial column structures comprise initial dummy gates, respectively;
    forming an initial ring-shaped structure over the semiconductor substrate and laterally surrounding at least one of the initial column structures, wherein the initial ring-shaped structure comprises an initial ring-shaped gate;
    forming a collector region in the semiconductor substrate, wherein the collector region is formed laterally surrounding the emitter region, the initial ring-shaped structure, and at least one of the plurality of initial column structures;
    forming a base region in the semiconductor substrate and between the emitter region and the collector region;
    forming a first dielectric layer over the semiconductor substrate and covering the plurality of initial column structures, the initial ring-shaped structure, the emitter region, the collector region, and the base region;
    performing a chemical-mechanical planarization (CMP) process into the first dielectric layer to expose the initial dummy gates and the initial ring-shaped gate; and
    reacting the initial dummy gates and the initial ring-shaped gate with a transition metal, thereby forming final column structures and a final ring-shaped structure.

9. The method of claim 8, further comprising:
    after the final column structures and the final ring-shaped structure are formed, forming a second dielectric layer over the first dielectric layer and covering the final column structures and the final ring-shaped structure; and after the second dielectric layer is formed, forming one or more conductive contacts over the semiconductor substrate and vertically extending through an upper surface of the first dielectric layer and an upper surface of the second dielectric layer.

10. The method of claim 8, wherein forming the initial column structures and the initial ring-shaped structure comprises:

forming a third dielectric layer over the semiconductor substrate and covering the emitter region;

forming a processing layer on the third dielectric layer;

patterning the processing layer to form the initial dummy gates and the initial ring-shaped gate; and patterning the third dielectric layer to form a plurality of gate oxide layers and a ring-shaped gate oxide layer, wherein the plurality of gate oxide layers separate the semiconductor substrate from the initial dummy gates, respectively, and wherein the ring-shaped gate oxide layer separates the semiconductor substrate from the initial ring-shaped gate.

11. A method for forming an integrated circuit, the method comprising:

forming an emitter region in a semiconductor substrate;

forming a ring-shaped structure over the semiconductor substrate, wherein the ring-shaped structure is formed within a perimeter of the emitter region;

forming a collector region in the semiconductor substrate and laterally surrounding both the emitter region and the ring-shaped structure;

forming a base region in the semiconductor substrate and between the emitter region and the collector region; and forming a first dielectric layer over the semiconductor substrate and covering the ring-shaped structure, the emitter region, the collector region, and the base region.

12. The method of claim 11, further comprising:
before the first dielectric layer is formed, forming a sidewall spacer along sidewalls of the ring-shaped structure.

13. The method of claim 11, further comprising:
performing a chemical-mechanical planarization (CMP) process into the first dielectric layer and the ring-shaped structure.

14. The method of claim 13, further comprising:
after the CMP process is performed, forming a second dielectric layer over the first dielectric layer and covering the ring-shaped structure.

15. The method of claim 14, further comprising:
after the second dielectric layer is formed, forming a plurality of conductive contacts over the semiconductor substrate and vertically extending through an upper surface of the first dielectric layer and an upper surface of the second dielectric layer.

16. The method of claim 11, further comprising:
before the first dielectric layer is formed, forming a plurality of column structures over the semiconductor substrate, wherein the ring-shaped structure laterally surrounds at least one of the plurality of column structures.

17. The method of claim 16, further comprising:
performing a chemical-mechanical planarization (CMP) process into the first dielectric layer, the plurality of column structures, and the ring-shaped structure.

18. The method of claim 11, wherein the ring-shaped structure comprises:
a ring-shaped gate dielectric layer disposed over the semiconductor substrate; and
a ring-shaped gate overlying the ring-shaped gate dielectric layer.

19. The method of claim 1, wherein at least one of the plurality of column structures is formed within a perimeter of the emitter region.

20. The method of claim 1, wherein the first isolation structure, the second isolation structure, and the third isolation structure are formed before the plurality of column structures are formed.

* * * * *